United States Patent
Romano et al.

(10) Patent No.: US 6,794,737 B2
(45) Date of Patent: Sep. 21, 2004

(54) SPRING STRUCTURE WITH STRESS-BALANCING LAYER

(75) Inventors: Linda T. Romano, Sunnyvale, CA (US); David K. Fork, Los Altos, CA (US)

(73) Assignee: Xerox Corporation, Stamford, CT (US)

( * ) Notice: Subject to any disclaimer, the term of this patent is extended or adjusted under 35 U.S.C. 154(b) by 0 days.

(21) Appl. No.: 09/976,394

(22) Filed: Oct. 12, 2001

(65) Prior Publication Data

US 2003/0071330 A1 Apr. 17, 2003

(51) Int. Cl.[7] .................. H01L 21/50; H01L 21/44; H01L 23/495; H01L 23/48; H01L 23/053; H05K 3/30
(52) U.S. Cl. .................. 257/669; 257/698; 257/696; 438/123; 438/652; 29/832
(58) Field of Search ................. 257/718, 726, 257/786, 784, 669, 696, 698; 438/652, 666, 123; 29/832; 439/81

(56) References Cited

U.S. PATENT DOCUMENTS

| | | | |
|---|---|---|---|
| 3,842,189 A | 10/1974 | Southgate | |
| 5,613,861 A | 3/1997 | Smith et al. | |
| 6,236,491 B1 | 5/2001 | Goodwin-Johansson | |
| 6,290,510 B1 * | 9/2001 | Fork et al. | 439/81 |
| 6,361,331 B2 * | 3/2002 | Fork et al. | 439/81 |
| 6,528,250 B1 * | 3/2003 | Montelaro et al. | 435/5 |
| 6,560,861 B2 * | 5/2003 | Fork et al. | 29/842 |
| 6,658,728 B2 * | 12/2003 | Fork et al. | 29/832 |

* cited by examiner

Primary Examiner—Nathan J. Flynn
Assistant Examiner—Victor A. Mandala, Jr.
(74) Attorney, Agent, or Firm—Bever, Hoffman & Harms, LLP; Patrick T. Bever

(57) ABSTRACT

A stress-balancing layer formed over portions of a spring metal finger that remain attached to an underlying substrate to counter internal stresses inherently formed in the spring metal finger. The (e.g., positive) internal stress of the spring metal causes the claw (tip) of the spring metal finger to bend away from the substrate when an underlying release material is removed. The stress-balancing pad is formed on an anchor portion of the spring metal finger, and includes an opposite (e.g., negative) internal stress that counters the positive stress of the spring metal finger. A stress-balancing layer is either initially formed over the entire spring metal finger and then partially removed (etched) from the claw portion, or selectively deposited only on the anchor portion of the spring metal finger. An interposing etch stop layer is used when the same material composition is used to form both the spring metal and stress-balancing layers.

19 Claims, 4 Drawing Sheets

SPRING STRUCTURE WITH STRESS-BALANCING LAYER

FIELD OF THE INVENTION

This invention generally relates to stress-engineered metal films, and more particularly to photo lithographically patterned spring structures formed from stress-engineered metal films.

BACKGROUND OF THE INVENTION

Photo lithographically patterned spring structures (sometimes referred to as "micro-springs") have been developed, for example, to produce low cost probe cards, and to provide electrical connections between integrated circuits. A typical spring includes a spring metal finger having a flat anchor portion secured to a substrate, and a curved claw extending from the anchor portion and bending away from the substrate. The spring metal finger is formed from a stress-engineered metal film (i.e., a metal film fabricated such that its lower portions have a higher internal compressive stress than its upper portions) that is at least partially formed on a release material layer. The claw of the spring metal finger bends away from the substrate when the release material located under the claw is etched away. The internal stress gradient is produced in the spring metal by layering different metals having the desired stress characteristics, or using a single metal by altering the fabrication parameters. Such spring metal structures may be used in probe cards, for electrically bonding integrated circuits, circuit boards, and electrode arrays, and for producing other devices such as inductors, variable capacitors, and actuated mirrors. For example, when utilized in a probe card application, the tip of the claw is brought into contact with a contact pad formed on an integrated circuit, and signals are passed between the integrated circuit and test equipment via the probe card (i.e., using the spring metal structure as a conductor). Other examples of such spring structures are disclosed in U.S. Pat. No. 3,842,189 (Southgate) and U.S. Pat. No. 5,613,861 (Smith).

The present inventors recognized that most failures of spring structures (e.g., separation of the spring structure from an underlying substrate through delamination or peeling) occur a significant amount of time after fabrication. The present inventors believe these failures are caused at least in part by the internal stress gradient retained in the anchor portion of the spring metal finger. That is, although the internal stress is essentially relieved in the claw of the spring metal finger upon release, the internal stress is retained in the anchor portion of the spring metal finger, along with other "trace" or unreleased portions of the spring metal layer. Over time, this retained internal stress is believed to bend the edges of the anchor portion upward (i.e., away from the underlying substrate), thereby causing delamination or peeling that weakens the attachment of the spring metal finger to the substrate. It is essential that the unlifted anchor portion of the spring metal finger adheres to the substrate (i.e., that the anchor portion resists the internal stress tending to bend the edges of the anchor portion away from the substrate). Most probing and packaging applications require large amounts of contact force (~50–100 mg) between the claw tip and a contacted structure. The force scales quadratically with film thickness, but the peeling moment increases also.

One possible solution to the delamination/peeling problem is to use a spring material in which the stress is annealed out after release (i.e., after the claw of the spring metal finger is allowed to bend away from the substrate). However, this solution places other limitations on the material properties, such as a reduction in the total stress differential.

Another solution is to incorporate a ductile, dry etchable metal such as Aluminum (Al) or Titanium (Ti) as an interfacial release layer between the substrate and the finger metal. This approach has been demonstrated to improve adherence of the anchor portion to the substrate when the thickness and/or internal stress of the spring metal layer is relatively small, but is less effective as the thickness or the stress of the metal layer is increased.

What is needed is a spring structure that resists delamination and/or peeling, thereby improving the strength and durability of the spring structures.

SUMMARY OF THE INVENTION

In accordance with the present invention, the strength and durability of a spring structure is increased by providing a stress-balancing pad formed on the unlifted anchor portion of the spring metal finger, where the stress-balancing pad is formed with an internal stress gradient (and stress moment) that is opposite in sign to the internal stress gradient (and stress moment) of the spring metal finger. Specifically, in contrast to the spring metal finger, the stress-balancing pad is formed from a stress-engineered metal film fabricated such that portions furthest from the anchor portion have a higher internal compressive stress than portions closest to the anchor portion. This opposite internal stress gradient causes the stress-balancing pad to apply a downward force on the edges of the anchor portion, thereby resisting the delamination or peeling of the anchor portion that can result in separation from an underlying substrate. In one embodiment, the internal stress gradient (and moment) of the stress-balancing pad has a magnitude that is equal to or greater than the internal stress gradient (and moment) of the spring metal finger, thereby preventing delamination or peeling of the anchor portion by completely countering (nullifying) the internal stress (and moment) of the spring metal finger.

In accordance with an aspect of the present invention, the spring metal finger and the stress-balancing pad can be formed either from materials that have the same composition, or from materials that have different compositions. For example, both the spring metal finger and the stress-balancing pad can be formed from Mo or MoCr. The fabrication process is simplified when the same material is used for both layers because the number of targets in the deposition equipment is minimized. However, an etch stop layer (e.g., Cr or Ti) may be needed between the spring metal finger and the stress-balancing pad to prevent undesirable etching of the spring metal finger during the fabrication process. When different materials are used, it may be necessary to increase the number of deposition equipment targets, but the etch stop layer can be omitted when the two materials are selectively etchable. For example, a stress-balancing pad formed from Mo is selectively etched from a spring metal finger formed from MoCr using an anisotropic fluorine etch. Similarly, a stress-balancing pad formed from Ti solution hardened with Si (Ti:Si) is selectively removed from a spring metal finger formed from NiZr using a Ti etch. Note that the stress-balancing pad can be electrically conducting or non-conducting, but electrical conductivity of the stress-balancing pad beneficially improves the total conductance through the anchor portion of the spring metal finger, and through other trace structures formed on the substrate using the spring metal and stress-balancing layers.

In accordance with another aspect of the present invention, the spring structure further includes a support pad formed between the anchor portion of the spring metal finger and the substrate. When formed from a conductive material (e.g., Ti), the support pad may be utilized to conduct signals between the spring metal finger and a conductor formed on the substrate under the support pad. In one embodiment, the support pad is formed from a portion of the release material layer.

In accordance with yet another aspect of the present invention, a spring structure is fabricated by forming a spring metal island on a release material island, forming the stress-balancing pad over an anchor portion of the spring metal island, and then releasing the claw portion of the spring metal finger by removing an associated portion of the release material island.

In accordance with a first disclosed method, a release material layer, a spring metal layer, and a stress-balancing layer are sequentially deposited and then etched using a first mask to form the spring metal and release material islands. In the first method, a stress-balancing island is formed that completely covers the spring metal island. A release mask is then used both to remove a portion of the stress-balancing island located over the claw portion of the spring metal island, thereby forming the stress-balancing pad on the anchor portion, and to etch the release material located under the claw portion of the spring metal island. A portion of the release material is utilized to form the support pad under the anchor portion. The first method minimizes the number of fabrication steps, but typically requires the use of different material compositions to form the spring metal layer and the stress-balancing layer.

In accordance with a second disclosed method both the spring metal and stress-balancing layers are formed from the same material composition, but requires an intervening etch stop layer. The second method is otherwise similar to the first method in that both the spring metal layer and the stress-balancing layer (along with the intervening etch stop layer) are deposited/grown before the spring metal mask is used to pattern the spring metal and stress-balancing islands. The second method may require more processing time than the first method, but reduces the number of targets needed in the deposition equipment, thereby potentially reducing deposition system overhead associated with process and control calibration.

Similar to the second method, a third disclosed method facilitates forming the spring metal finger and the stress-balancing pad using the same material composition, but avoids the need for an etch stop layer by utilizing a special mask to lift off pattern the stress-balancing pad onto the anchor portion of the spring metal finger. In particular, the release material layer and a spring metal layer are sequentially deposited and then etched using a first mask to form the spring metal and release material islands. A second mask is then used that exposes the anchor portion of the spring metal island, but covers the claw portion. A stress-balancing layer is then deposited which forms the stress-balancing pad on the anchor portion when the second mask is lifted off. A release mask is then used to etch release material located under the claw portion to release the claw. Although fabrication costs are increased because three masks are required, the third method provides the benefits associated with using the same material composition for both the spring metal finger and the stress-balancing pad without requiring an intervening etch stop layer. If desired, the mask count can be reduced by using the stress balancing pad to define the release window, but this approach may modify the design rules undesirably.

Similar to the third method, fourth possible method also utilizes three masks to form the spring metal finger, but the stress balancing pad is formed before the spring metal island is etched. In particular, a release material layer, a spring metal layer, and a stress balancing layer are sequentially deposited. A first mask is then used to etch only the stress balancing layer, thereby forming the stress balancing pad. The spring metal layer and release layer are then etched using a second mask to form the spring metal and release material islands. A release mask is then used to etch release material located under the claw portion to release the claw.

BRIEF DESCRIPTION OF THE DRAWINGS

These and other features, aspects and advantages of the present invention will become better understood with regard to the following description, appended claims, and accompanying drawings, where:

DETAILED DESCRIPTION OF THE DRAWINGS

Figure 1:
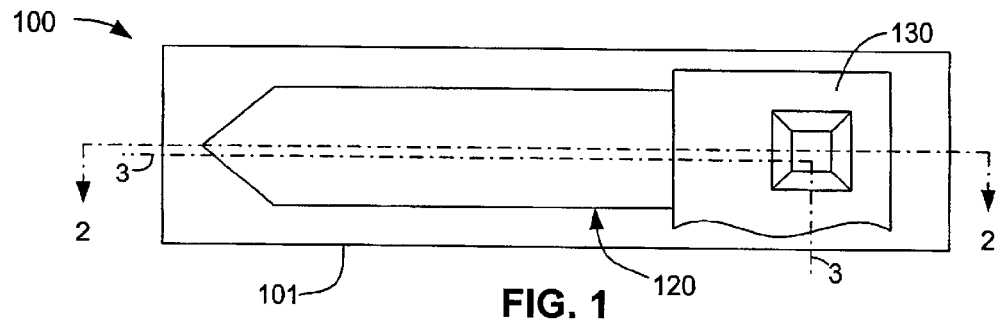
FIG. 1 is a plan view showing a spring structure according to a first embodiment of the present invention.
Figure 2:
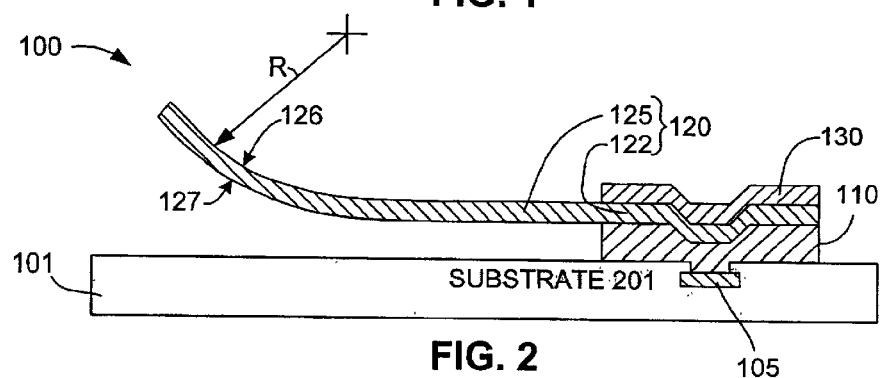
FIG. 2 is a cross-sectional side view of the spring structure taken along section line 2—2 of FIG. 1, and the spring structure contacting a separate integrated circuit.
Figure 3:
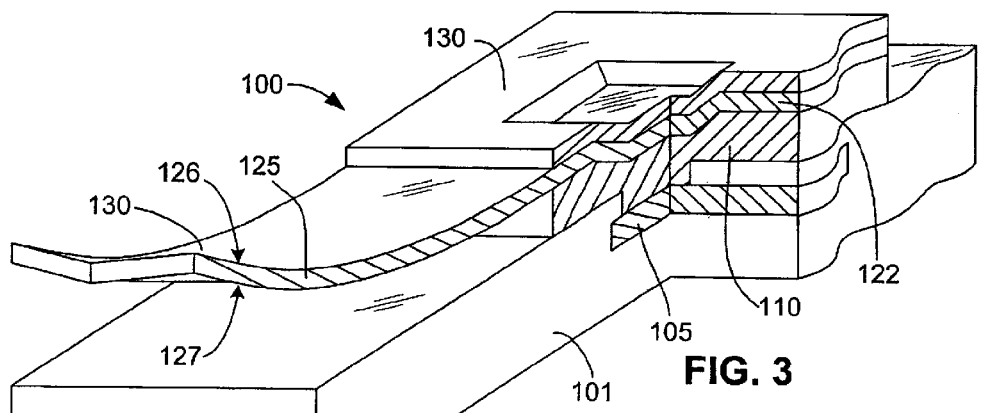
FIG. 3 is a cut-away perspective view of the spring structure shown in FIG. 1.

As used herein, the terms "spring metal" and "stress-balancing" are used to identify stress-engineered metal structures fabricated with opposite internal stress gradients. In particular, the term "spring metal layer" identifies a metal film fabricated such that its lower portions (i.e., closest to a support substrate) have a higher internal compressive stress than its upper portions. In contrast, the term "stress-balancing layer" identifies a metal film fabricated such that its lower portions (i.e., closest to substrate 101) have a lower internal compressive stress than its upper portions (i.e., such that the stress-balancing layer has an internal stress gradient that is opposite to that of the spring metal layer). Note that a portion of the intrinsic stress in either layer may be tensile. In addition, the term "island" is used to refer to patterned layer portions prior to the release process. For example, the term "spring metal island" refers to a patterned portion of the spring metal layer including an unreleased (unlifted) claw portion and an anchor portion, whereas the term "spring metal finger" refers to the same patterned portion after the claw is released. Similarly, the terms "stress-balancing island" and "release material island" refer to patterned portions of the stress-balancing layer and a release material layer that are located over and under the spring metal island, respectively.

FIGS. 1, 2, 3, and 4 show a spring structure 100 according to a first embodiment of the present invention. Spring structure 100 generally includes a substrate 101, a support pad 110, a spring metal finger 120, and a stress-balancing pad 130. Substrate 101 (e.g., glass) includes an optional conductor 105 that can take several forms (i.e., a metal line deposited on the substrate or a buried conductor accessed by an opening in a passivation layer). When present, conductor 105 may provide electrical connection between electronic components of an integrated circuit and spring structure 100. Alternatively, if substrate 101 is printed circuit board, printed wiring board, silicon device, or interposer, then conductor 105 may be an exposed portion of conducting material that is electrically connected to redistribution traces, through substrate vias, solder bumps, solder balls, mounted electrical components, integrated passive components, or interconnect pads.

Support pad 110 is formed on an upper surface of substrate 101 such that it contacts conductor 105 (if present). In one embodiment, support pad 110 is formed from a release material layer that is partially sacrificed to release a claw portion 125 of spring metal finger 120. When formed from release material, support pad 110 may be titanium that is sputter deposited onto substrate 101 to a thickness of approximately 50 nm or greater. Titanium provides desirable characteristics as a release material layer due to its plasticity (i.e., its resistance to cracking). Other release materials having the beneficial plastic characteristics of titanium may also be used. In other embodiments, support pad 110 includes another metal, such as Copper (Cu), Aluminum (Al), Nickel (Ni), Zirconium (Zr), or Cobalt (Co). By selecting a conductive release material, support pad 110 provides electrical connection between spring metal finger 120 and conductor 105 (when present). In another embodiment, support pad 110 may be formed from a non-conducting release material, and a strap or other conducting structure may be formed between spring metal finger and an exposed conductor. In yet another embodiment, support portion 110 may be formed from a material different from the release material by separately patterning the release material and support portion 110 using known techniques.

Spring metal finger 120 includes an anchor portion 122 and a claw (i.e., cantilevered portion) 125. Anchor portion 122 is attached to substrate 101 via support pad 110 (i.e., such that support pad 110 is located between anchor portion 122 and substrate 101). Claw 125, which includes a tip 125-T, extends from anchor portion 122 over substrate 101. Spring metal finger 120 is etched from a stress-engineered metal film that is deposited by DC magnetron sputtering one or more metals using gas (e.g., Argon) pressure variations in the sputter environment during film growth. These pressure variations are controlled using known techniques to generate an internal stress gradient that causes claw 125 to bend away from substrate 101 when an underlying release material is removed. Note that although much of this internal stress gradient is essentially relieved in the lifted claw 125, anchor portion 122 retains a substantial amount of internal stress.

As discussed above, the present inventors recognized that most failures of spring structures (i.e., separation of the spring structure from an underlying substrate through delamination or peeling) occur a significant amount of time after fabrication.

In accordance with an aspect of the present invention, stress-balancing pad 130 is formed on anchor portion 122 of spring metal finger 120 to counterbalance the internal stress gradient tending to separate (e.g., delaminate or peel) anchor portion 122 from support pad 110. Similar to spring metal finger 120, stress-balancing pad 130 is formed using a stress-engineered metal film that is deposited by DC magnetron sputtering one or more metals using gas pressure variations in the sputter environment during film growth. However, stress-balancing pad 130 is formed using a pressure variation sequence that is opposite to that utilized to generate spring metal finger 120, thereby causing stress-balancing pad 130 to include an internal stress that is opposite to that provided in spring metal finger 120. In one embodiment, the opposite stress gradient is achieved by beginning the deposition process under conditions known to produce tensile stress, and then lowering the deposition sputter pressure in one or more steps to add one or more layers that are more compressive. Ideally, the layers are engineered to produce a metal stack with zero net stress and zero net moment. Accordingly, stress-balancing pad 130 exerts a downward force (i.e., toward substrate 101) on the edges of anchor portion 122 that counterbalances the upward force generated by the internal stress gradient of spring metal finger 120, thereby resisting delamination or separation of anchor portion 122 from substrate 101.

Figure 4:
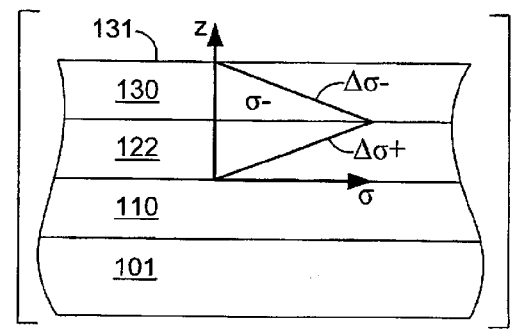
FIG. 4 is a partial side view showing internal stresses formed in respective layers of the spring structure shown in FIG. 1.

FIG. 4 is partial side view in which internal stress gradients are superimposed over portions of anchor portion 122 and stress-balancing pad 130. As indicated in the lower portion of FIG. 4, anchor portion 122 is etched from a stress-engineered metal film that has a positive stress gradient $\Delta\sigma+$ (i.e., tending to bend the edges of anchor portion 122 away from substrate 101), whereas stress-balancing pad 130 is etched from a stress-engineered metal film that has a negative-stress gradient $\Delta\sigma-$ (i.e., tending to bend the edges of stress-balancing pad 130 downward toward substrate 101). According to an embodiment the present invention, the negative stress gradient (and resulting stress moment) of stress-balancing pad 130 is equal in magnitude to or greater in magnitude than the positive stress gradient (and resulting stress moment) of anchor portion 122 such that zero net stress (and zero peeling moment) exists at an upper surface 131 of stress-balancing pad 130 is essentially nullified or slightly negative, thereby reliably preventing the separation of anchor portion 122. However, in other embodiments the stress gradient magnitude of stress-balancing pad 130 may be less than that of anchor portion 122 and still prolong the operational lifetime of spring structure 100 beyond that of conventional structures produced without stress-balancing pad 130.

FIGS. 5(A)–5(K), 6(A)–6(M), and 7(A)–7(L) are cross-sectional side views illustrating three methods for fabricating spring structures incorporating the stress-balancing pad of the present invention.

In a first method, shown in FIGS. 5(A)–5(K), both a spring metal layer and a stress-balancing layer are deposited/grown before the spring metal finger is processed (e.g., masked, etched and released). The first method requires a minimum number of processing steps, but typically requires forming the spring metal layer and the stress-balancing layer using different material compositions, and selectively etching a portion of the stress-balancing layer located over the claw portion of the spring metal finger.

Figure 5A:
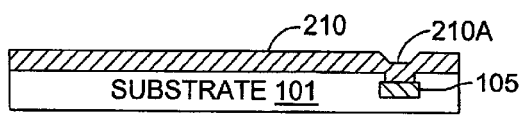
FIGS. 5(A) through 5(K) are cross-sectional side views showing fabrication steps associated with the production of the spring structure shown in FIG. 1 according to a first method.

Referring to FIG. 5(A), the first fabrication method begins with the formation of a release material layer 210 over a substrate 101 (e.g., silicon). In one embodiment, release material layer 210 is formed from an electrically conductive material, and a portion 210A of release material layer 210 contacts a conductor 105 that is exposed on the upper surface of substrate 101. In one embodiment, release material layer 210 is Titanium (Ti) that is sputter deposited onto substrate 101 to a thickness of approximately 0.2 microns or greater.

Figure 5B:
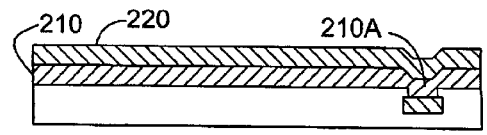

FIG. 5(B) shows a stress-engineered spring metal layer 220 formed on release material layer 210 using known processing techniques such that it includes internal stress variations in the growth direction (i.e., as shown in FIG. 4). Methods for generating such internal stress variations in spring metal layer 220 are taught, for example, in U.S. Pat. No. 3,842,189 (depositing two metals having different internal stresses) and U.S. Pat. No. 5,613,861 (e.g., single metal sputtered while varying process parameters), both of which being incorporated herein by reference. In one embodiment, which utilizes a 0.2 micron Ti release material layer, spring metal layer 220 includes Molybdenum and Chromium (MoCr) sputter deposited to a thickness of 1 micron.

Figure 5C:
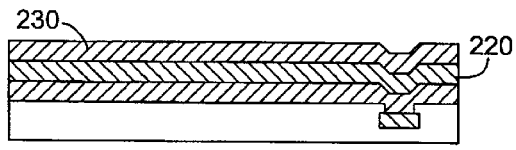

Referring to FIG. 5(C), a stress-balancing layer 230 is then formed on spring metal layer 220 using gas pressure variations that generate an internal stress gradient opposite to that of spring metal layer 220. Stress-balancing layer 230 is preferably formed from a material composition (e.g., Mo having a thickness of 1 micron) that is different from that utilized to form spring metal layer 2201. As discussed below, by forming stress-balancing layer 230 and spring metal layer 220 from different material compositions, selective etching may be utilized to remove portions of stress-balancing layer 230 without undesirably etching spring metal layer 220.

Figure 5D:
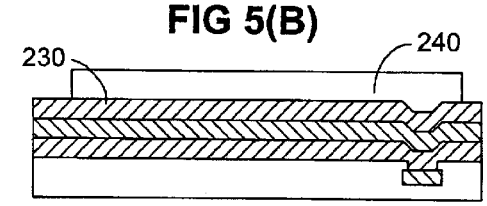

FIG. 5(D) shows a spring metal (first) mask 240 (e.g., photoresist) that is patterned on a selected portion of stress-balancing layer 230. Note that spring metal mask 240 extends over an associated conductor 10S (if present).

Figure 5E:
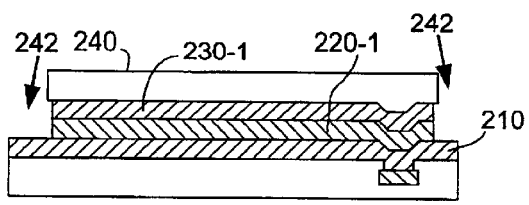

Next, as indicated in FIG. 5(E), exposed portions of the stress-balancing layer and the spring metal layer surrounding mask 240 are etched using one or more etchants 242 to form a laminated structure including a stress-balancing island 230-1 on a spring metal island 220-1. Note that this etching process is selectively performed to minimize etching of release material layer 210 that surround spring metal island 220-1. In one embodiment, a Mo stress-balancing layer and a MoCr spring metal layer are etched using a Cr etch, which does not significantly etch an underlying Ti release material layer.

Figure 5F:
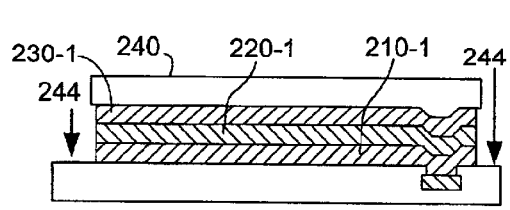

FIG. 5(F) shows a subsequent anisotropic etching process during which exposed portions of the release material layer surrounding spring metal island 220-1 are removed to form a release material island 210-1. When a Ti release material layer is used, anisotropic etching may be performed using fluorine plasma.

Figure 5G:
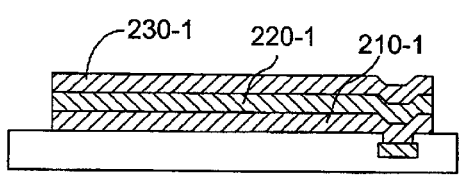
Figure 5H:
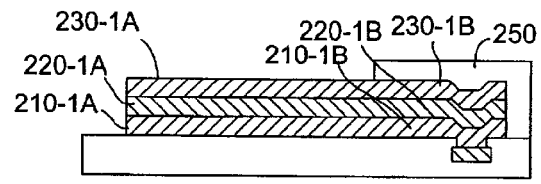

Referring to FIGS. 5(G) and 5(H), the spring metal mask is then removed, and a release (second) mask 250 is formed that exposes a first portion 210-1A of the release material island, a first (claw) portion 220-1A of the spring metal island, and a first portion 230-1A of the stress-balancing island. In particular, release mask 250 is formed over a second portion 210-1B of the release material island, a second (anchor) portion 220-1B of the spring metal island, and a second portion 230-1B of the stress-balancing island, which, as described below, forms the stress-balancing pad of the present invention.

Figure 5I:
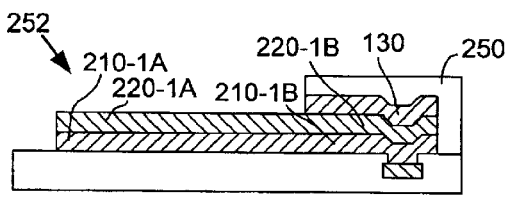

As shown in FIG. 5(I), an etchant 252 is then used to selectively etch the exposed first portion of the stress-balancing island, thereby forming stress-balancing pad 130. When the stress-balancing layer is Mo and the spring metal layer is MoCr, an anisotropic fluorine plasma etchant 252 is used, which does not etch claw portion 220-1B.

Figure 5J:
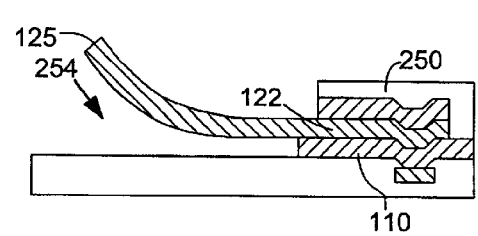

Subsequently, as shown in FIG. 5(J), a release etchant 254 (e.g., a buffered oxide etch to remove Ti release material) is used to selectively remove the first portion of the release material layer from beneath the claw portion of the spring metal island to form support pad 110, claw 125, and anchor portion 122. Specifically, removal of the exposed release material causes claw 125 to bend away from substrate 101 due to the internal stress variations established during the formation of the spring metal layer (discussed above). Note that anchor portion 122 remains attached to substrate 101 via support pad 110, which, along with stress-balancing pad 130, is protected during the release process by release mask 250.

Figure 5K:
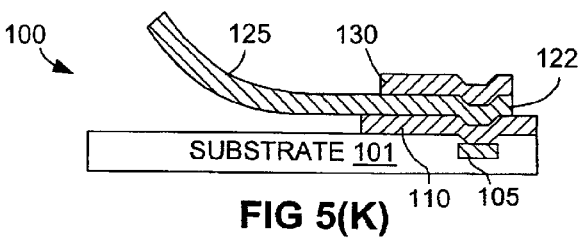

Finally, as shown in FIG. 5(K), the release mask is removed to complete the fabrication of spring structure 100, which is discussed above with reference to FIGS. 1–4.

In an alternative to the first method described above with reference to FIGS. 5(A)–5(K), spring metal layer 220 (FIG. 5(B)) is formed using Nickel-Zirconium (NiZr), and stress-balancing layer 230 (FIG. 5(C)) is formed by Ti solution hardened with Si (Ti:Si). This alternative embodiment reduces fabrication costs by allowing the stress-balancing layer etch (FIG. 5(I)) and the release process (FIG. 5(J)) to be performed simultaneously using a single Ti etchant (e.g., a buffered oxide etch) that does not etch the NiZr claw portion of the spring metal finger.

Figure 6A:
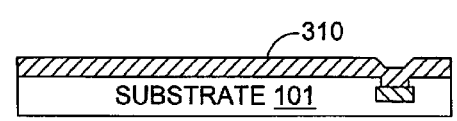
FIGS. 6(A) through 6(M) are cross-sectional side views showing fabrication steps associated with the production of an alternative spring structure according to a second method.
Figure 6B:
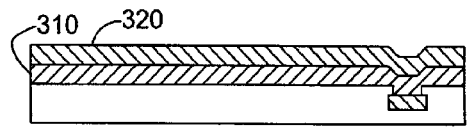
Figure 6C:
Figure 6D:
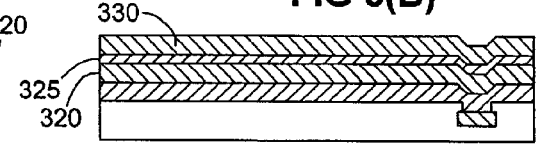
Figure 6E:
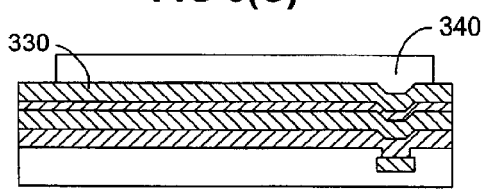

FIGS. 6(A)–6(M) depict a second fabrication method that is similar to the first method in that a release material layer 310 (FIG. 6(A)), a spring metal layer 320 (FIG. 6(B)), and a stress-balancing layer 330 (FIG. 6(D)) are deposited/grown before the spring metal finger is processed. However, in accordance with the second method, stress-balancing layer 330 and spring metal layer 320 are formed from the same material, thereby reducing the number of targets required in the deposition equipment, but requiring the deposition of an etch stop layer 325, as shown in FIG. 6(C), on spring metal layer 320 and sandwiched by the subsequently-formed stress-balancing layer 330 (shown in FIG. 6(D)). One embodiment of the second method utilizes a Ti release layer 310, a Mo spring metal layer 320, a Cr etch stop layer 325, and a Mo stress-balancing layer 330.

Subsequent processing in accordance with the second method is similar to the first method. A spring metal (first) mask 340 is formed over stress-balancing layer 330 (FIG. 6(E)), and a first etchant (e.g., a Cr etch) 342 is utilized to form spring metal island 320-1, etch stop island 325-1, and stress-balancing island 330-1 (FIG. 6(F)). Subsequently, a second etchant 344 (e.g., anisotropic etching using fluorine plasma) is utilized to etch the release material layer to form a release material island 310-1 (FIG. 6(G)), and the spring metal mask is removed (FIG. 6(H)). A release mask 350 is then formed that exposes a (first) portion 330-1 of the stress-balancing layer (FIG. 6(I)), and then this first portion is removed using etchant 352 (e.g., anisotropic etching using fluorine plasma; FIG. 6(J)). An optional additional etchant 353 is then utilized, if necessary, to remove a portion 325-1A of the etch stop material form claw portion 320-1A (FIGS. 6(J) and 6(K)), and then a release etchant 354 is utilized to release claw 125-A (FIG. 6(L)), which then forms a spring structure 100-A (FIG. 6(M)) having essentially the same characteristics described above with reference to FIGS. 1–4, wherein a portion 325-A of the etch stop layer is formed between anchor portion 122-A of the spring metal finger and stress balancing pad 130-A.

Figure 6F:
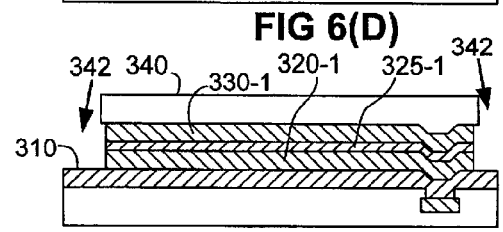
Figure 6G:
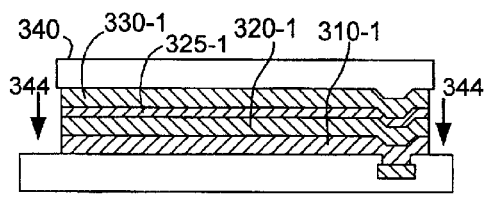
Figure 6H:
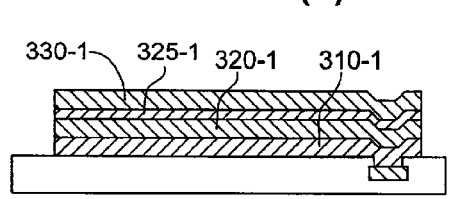

In an alternative to the second method, the single-step island formation etch (FIG. 6(F)) is replaced with a three-step process that includes forming the Mo stress-balancing island 330-1 by anisotropically etching the stress-balancing layer using fluorine plasma, forming Cr etch stop island 325-1 using a Cr etch, and then forming the Mo spring metal island 320-1 by anisotropically etching the spring metal layer using fluorine plasma. Although this alternative increases the number of etching steps, the feature definition of the resulting spring structure may be improved over that produced using the single-step island formation process described above.

In another alternative to the second method, release material layer 310 (FIG. 6(A)) is formed using Si, spring metal layer 320 (FIG. 6(B)) is formed using MoCr, etch stop layer 325 (FIG. 6(C)) is formed using Ti, and stress-balancing layer 330 (FIG. 6(D)) is formed using MoCr. Similar to the first alternative embodiment, a three-step island formation process is utilized (Cr etch, Ti etch, Cr etch) to form stress-balancing island 330-1, etch stop island 325-1, and spring metal island 320-1, respectively. Portion 330-1A of stress-balancing island 320-1 is subsequently etched using a Cr etch, and release is performed using a Xenon-Fluoride (XeF$_2$) etchant 354.

Figure 7A:
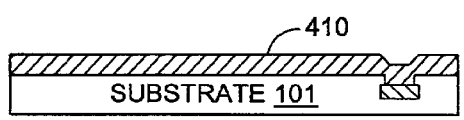
FIGS. 7(A) through 7(L) are cross-sectional side views showing fabrication steps associated with the production of the spring structure shown in FIG. 1 according to a third method.
Figure 7B:
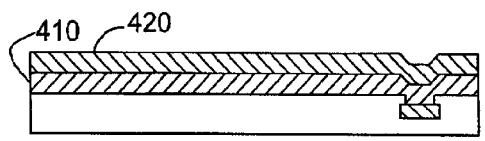
Figure 7C:
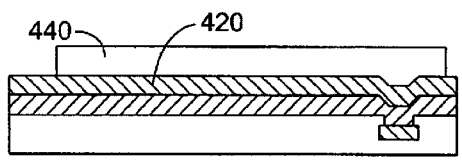
Figure 7D:
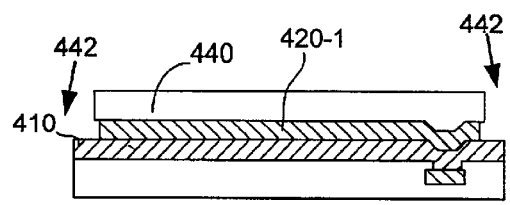
Figure 7E:
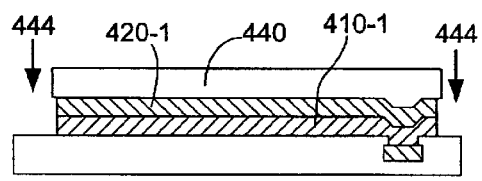
Figure 7F:
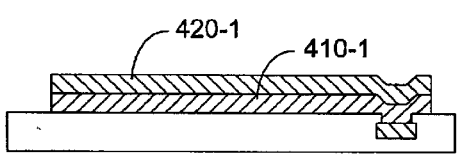
Figure 7G:
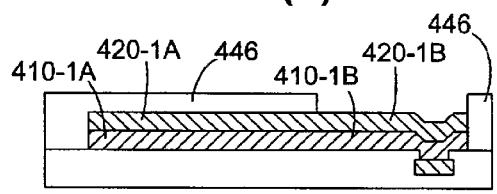
Figure 7H:
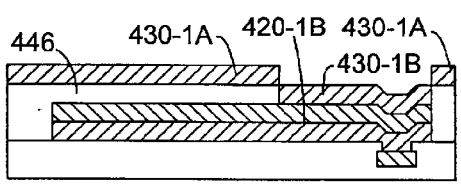
Figure 7I:
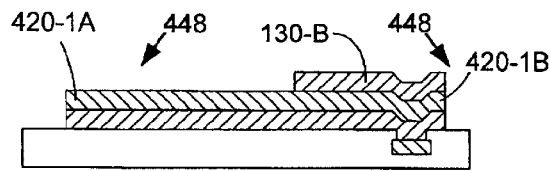
Figure 7J:
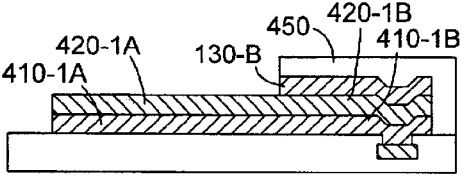
Figure 7K:
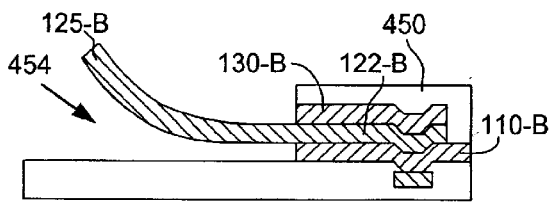
Figure 7L:
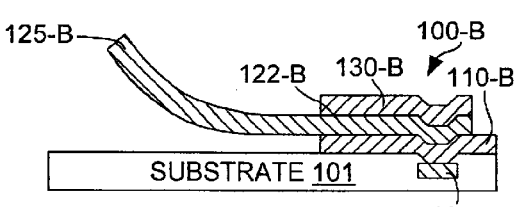

FIGS. 7(A)–7(L) depict a third fabrication method in a (e.g., Ti) release material layer 410 (FIG. 7(A)) and a (e.g., MoCr) spring metal layer 420 (FIG. 7(B)) are formed, masked (FIG. 7(C)) and etched (FIGS. 7(D) and 7(E)) before a (e.g., MoCr) stress-balancing layer is deposited. Specifically, after forming spring metal island 420-1 and release material island 410-1 (FIGS. 7(D) and 7(E)), spring metal mask 440 is removed (FIG. 7(F)), and then a (second) mask 446 is formed that covers claw portion 420-1A and exposes anchor portion 420-1B (FIG. 7(G)). The stress-balancing layer is then deposited such that a first portions 430-1A is formed on mask 446, and a second portion 430-1B is formed on anchor portion 420-1B. Mask 446 is then lifted off along with first portions 430-1A (FIG. 7(I)) using known techniques to pattern stress-balancing pad 130-B, and then a release mask 450 is formed (FIG. 7(J)) that is utilized to release claw 125-B (FIG. 7(K)), and is then removed (FIG. 7(L)) to complete the fabrication of a spring structure 100-B having essentially the same characteristics described above with reference to FIGS. 1–4.

Figure 6I:
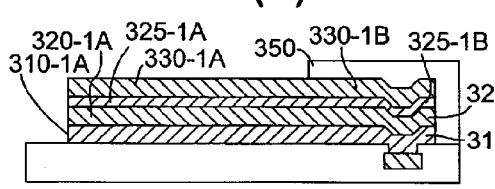
Figure 6J:
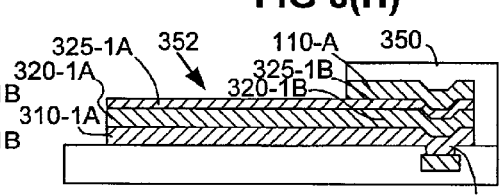
Figure 6K:
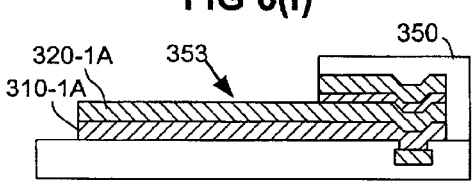
Figure 6L:
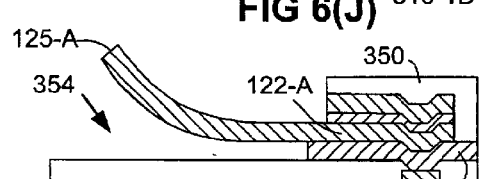
Figure 6M:
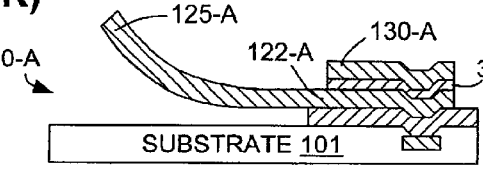

In accordance with yet another possible embodiment, three masks may be utilized to form the spring structure such that the stress balancing pad is formed before the spring metal island is etched. In particular, a release material layer, a spring metal layer, and a stress balancing layer are sequentially deposited (i.e., forming a structure similar to that shown in FIGS. 5(C) and 6(C)). A first mask is then patterned and used to etch only the stress balancing layer according to known techniques, thereby forming the stress balancing pad. The spring metal layer and release layer are then etched using a second mask (i.e., similar to that shown in FIGS. 5(D) and 6(D)) to form the spring metal and release material islands. A release mask (i.e., similar to that shown in FIGS. 5(H) and 6(I) is then used to etch release material located under the claw portion to release the claw. An intermediate etch stop layer may also be formed between the spring metal layer and the stress balancing layer in the manner described above.

Although the present invention has been described with respect to certain specific embodiments, it will be clear to those skilled in the art that the inventive features of the present invention are applicable to other embodiments as well, all of which are intended to fall within the scope of the present invention. For example, the disclosed process examples are not intended to be limited to the specific fabrication processes and material compositions. Other structures such as passivating layers, capping layers, devices, vias etc., may be incorporated in the process flow within the scope of the present invention. Further, the described embodiments utilize two layers having opposing gradient (i.e., the spring metal layer and the stress-balancing layer). However, spring structures exhibiting the same stress-nullifying benefits of the disclosed embodiments may be produce with other stress profiles (e.g., a series of stress-engineered layers that are compressive, tensile then compressive again).

What is claimed is:

1. A spring structure comprising:

a substrate;

a spring metal finger including an unlifted anchor portion attached to the substrate and a released claw portion extending over the substrate, wherein the anchor portion has a first internal stress gradient; and a stress-balancing pad formed on the anchor portion of the spring metal finger, wherein the stress-balancing pad has a second internal stress gradient that is opposite to the first internal stress gradient.

2. The spring structure according to claim 1, wherein the second internal stress gradient of the stress-balancing pad is equal in magnitude to or greater in magnitude than the first internal stress gradient of the anchor portion.

3. The spring structure according to claim 1, wherein both the spring metal finger and the stress-balancing pad consist essentially of a single material composition.

4. The spring structure according to claim 3, wherein the single material composition is one of Molybdenum (Mo) and Molybdenum-Chromium (MoCr).

5. The spring structure according to claim 3, further comprising an etch stop layer formed between the anchor portion of the spring metal finger and the stress-balancing pad.

6. The spring structure according to claim 5, wherein both the spring metal finger and the stress-balancing pad consist essentially of Molybdenum (Mo), and wherein the etch stop layer comprises Chromium (Cr).

7. The spring structure according to claim 5, wherein both the spring metal finger and the stress-balancing pad consist essentially of Molybdenum-Chromium (MoCr), and wherein the etch stop layer comprises Titanium (Ti).

8. The spring structure according to claim 1, wherein the spring metal finger comprises a first material, and wherein the stress-balancing pad comprises a second material that is different from the first material.

9. The spring structure according to claim 8, wherein the first material consists essentially of a Molybdenum-Chromium alloy (MoCr), and wherein the stress-balancing pad consists essentially of Molybdenum (Mo).

10. The spring structure according to claim 8, wherein the first material consists essentially of Nickel-Zirconium (NiZr), and wherein the second material consists essentially of Titanium that is solution hardened with Silicon (Ti:Si).

11. The spring structure according to claim 1, further comprising a support pad formed between the substrate and the anchor portion of the spring metal finger.

12. The spring structure according to claim 11, wherein the support pad comprises one of Titanium (Ti) and Silicon (Si).

13. The spring structure according to claim 11, wherein the support pad comprises Ti, wherein both the spring metal finger and the stress-balance portion comprise Molybdenum (Mo), and wherein the spring structure further comprises an etch stop layer consisting of Chromium (Cr) that is formed between the spring metal finger and the stress-balance portion.

14. The spring structure according to claim 11, wherein the support pad comprises Si, wherein both the spring metal finger and the stress-balance portion comprise Molybdenum-Chromium (MoCr), and wherein the spring structure further comprises an etch stop layer consisting of Titanium (Ti) formed between the spring metal finger and the stress-balance portion.

15. The spring structure according to claim 11, wherein the support pad comprises Titanium (Ti), wherein the spring metal finger comprises Molybdenum-Chromium (MoCr), and wherein the stress-balance portion comprise Molybdenum (Mo).

16. The spring structure according to claim 11, wherein the support pad comprises Ti, wherein the spring metal finger comprises Nickel-Zirconium (NiZr), and wherein the stress-balance portion comprises Titanium that is solution hardened with Silicon (Ti:Si).

17. The spring structure according to claim 11, further comprising a conductor formed on the substrate, wherein the support pad comprises an electrically conductive material, and wherein the spring metal finger is electrically connected to the conductor via the support pad.

18. A spring structure comprising:

a substrate;

a spring metal finger having an anchor portion supported by the substrate and a claw portion extending over the substrate; and a stress-balancing pad formed over the anchor portion of the spring metal finger, wherein the spring metal finger is formed from a first stress-engineered material having a first internal stress moment that causes the claw portion to bend away from the substrate, and wherein the stress-balancing pad is formed from a second stress-engineered material having a second internal moment that opposes to the first internal stress moment.

19. The spring structure according to claim 18, wherein the first internal stress moment of the anchor portion has a first magnitude, and wherein the second internal stress moment of the stress-balancing pad has a second magnitude that is equal to or greater than the first magnitude.

* * * * *

UNITED STATES PATENT AND TRADEMARK OFFICE
CERTIFICATE OF CORRECTION

PATENT NO. : 6,794,737 B2 Page 1 of 1
APPLICATION NO. : 09/976394
DATED : September 21, 2004
INVENTOR(S) : Linda T. Romano et al.

It is certified that error appears in the above-identified patent and that said Letters Patent is hereby corrected as shown below:

Column 1, line 3, insert as a new paragraph:

This invention was made with Government support under 70NANB8H4008 awarded by NIST. The Government has certain rights in this invention.

Signed and Sealed this

First Day of May, 2007

JON W. DUDAS
*Director of the United States Patent and Trademark Office*